(12) United States Patent
Kumo et al.

(10) Patent No.: US 9,196,802 B2
(45) Date of Patent: Nov. 24, 2015

(54) LIGHT-EMITTING DEVICE

(71) Applicant: Toyoda Gosei Co., Ltd., Kiyosu-shi, Aichi-ken (JP)

(72) Inventors: Atsushi Kumo, Kiyosu (JP); Toshiaki Mori, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 3 days.

(21) Appl. No.: 13/904,807

(22) Filed: May 29, 2013

(65) Prior Publication Data

US 2013/0320378 A1 Dec. 5, 2013

(30) Foreign Application Priority Data

May 29, 2012 (JP) ................... 2012-122153

(51) Int. Cl.
| | |
|---|---|
| H01L 33/00 | (2010.01) |
| H01L 33/56 | (2010.01) |
| H01L 33/54 | (2010.01) |
| H01L 33/50 | (2010.01) |

(52) U.S. Cl.
CPC ................ *H01L 33/56* (2013.01); *H01L 33/54* (2013.01); *H01L 33/50* (2013.01)

(58) Field of Classification Search
CPC ....... H01L 33/486; H01L 33/20; H01L 33/42; H01L 33/48; H01L 33/52; H01L 51/5262; H01L 51/5275
See application file for complete search history.

(56) References Cited

U.S. PATENT DOCUMENTS

| | | | | |
|---|---|---|---|---|
| 8,022,431 | B2 * | 9/2011 | Kaneko et al. ................ | 257/99 |
| 8,659,047 | B2 * | 2/2014 | Kondo ............................ | 257/99 |
| 2002/0145205 | A1 | 10/2002 | Hirano et al. | |
| 2005/0263777 | A1 * | 12/2005 | Yano et al. ..................... | 257/79 |
| 2006/0163602 | A1 * | 7/2006 | Isokawa ....................... | 257/100 |
| 2006/0192216 | A1 | 8/2006 | Ono | |
| 2007/0246731 | A1 * | 10/2007 | Isokawa et al. ............... | 257/99 |
| 2008/0084694 | A1 * | 4/2008 | Rose et al. .................... | 362/240 |
| 2010/0123151 | A1 * | 5/2010 | Hata et al. .................... | 257/98 |
| 2010/0148196 | A1 | 6/2010 | Kamada et al. | |
| 2013/0126900 | A1 | 5/2013 | Inoue et al. | |

FOREIGN PATENT DOCUMENTS

| | | |
|---|---|---|
| JP | 2000-124508 A | 4/2000 |
| JP | 2000-286457 A | 10/2000 |
| JP | 2005-005433 A | 1/2005 |
| JP | 2006-173271 A | 6/2006 |
| JP | 2006-237217 A | 9/2006 |
| JP | 2007-116109 A | 5/2007 |
| JP | 2009-239116 A | 10/2009 |
| JP | 2010-251481 A | 11/2010 |
| WO | WO 2012/020559 A1 | 2/2012 |

OTHER PUBLICATIONS

Japanese Office Action dated Mar. 17, 2015 with a partial English translation.

* cited by examiner

*Primary Examiner* — Victor A Mandala
(74) *Attorney, Agent, or Firm* — McGinn IP Law Group PLLC

(57) ABSTRACT

A light-emitting device includes a face-up type LED chip formed rectangular in a top view, and a rectangular parallelepiped-shaped sealing portion to seal the LED chip. An angle formed between a side surface of the LED chip and a side surface of the sealing portion in the top view is 45±13°, and a portion of light emitted from the LED chip is emitted from the side surface of the sealing portion.

17 Claims, 11 Drawing Sheets

13 SEALING PORTION
12 LED CHIP

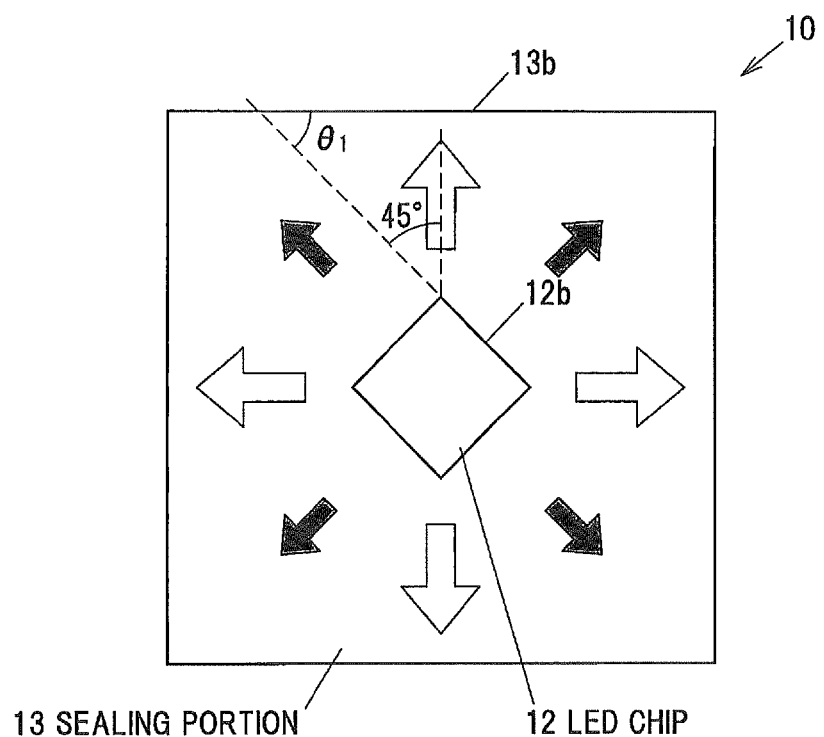
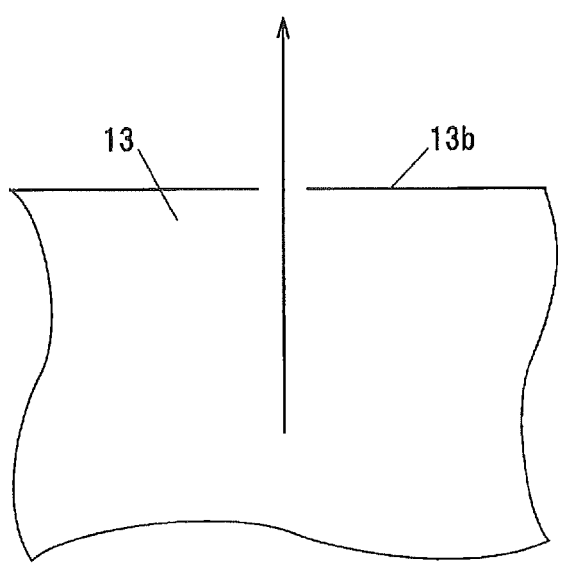

13b
45°
52b
13 SEALING PORTION
52 LED CHIP
50

13b  13
45°

US 9,196,802 B2

LIGHT-EMITTING DEVICE

The present application is based on Japanese patent application No. 2012-122153 filed on May 29, 2012, the entire contents of which are incorporated herein by reference.

BACKGROUND OF THE INVENTION

1. Field of the Invention

The invention relates to a light-emitting device.

2. Related Art

Conventionally, a light-emitting device in which a light-emitting element is sealed with a dome-shaped sealing resin is known (see, e.g., JP-A-2000-286457).

In the light-emitting device as is described in JP-A-2000-286457, since the sealing resin has a dome shape, an incident angle of light radially emitted from the light-emitting element onto a surface of the sealing resin is small in a wide area. Therefore, it is possible to suppress total reflection at an interface between the sealing resin and the air and thus to improve light extraction efficiency of the light-emitting element.

SUMMARY OF THE INVENTION

However, a manufacturing process of the dome-shaped resin sealing is more complicated, due to the shape thereof, than a sealing resin having a simple shape such as rectangular parallelepiped shape. Therefore, it is disadvantageous in that the manufacturing cost of the light-emitting device is high.

It is an object of the invention to provide a light-emitting device that may have a high light extraction efficiency or lower in a manufacturing cost.

(1) According to one embodiment of the invention, a light-emitting device comprises:
  a face-up type LED chip formed rectangular in a top view; and
  a rectangular parallelepiped-shaped sealing portion to seal the LED chip,
  wherein an angle between a side surface of the LED chip and a side surface of the sealing portion in the top view is 45±13°, and
  wherein a portion of light emitted from the LED chip is emitted through the side surface of the sealing portion.

(2) According to another embodiment of the invention, a light-emitting device comprises:
  a flip-chip type LED chip formed rectangular in a top view; and
  a rectangular parallelepiped-shaped sealing portion to seal the LED chip,
  wherein an angle between a side surface of the LED chip and a side surface of the sealing portion in the top view is 45±14°, and
  wherein a portion of light emitted from the LED chip is emitted through the side surface of the sealing portion.

In the above embodiment (1) or (2) of the invention, the following modifications and changes can be made.

(i) A refractive index of the sealing portion is greater than 1.41.

(ii) The angle between the side surface of the LED chip and the side surface of the sealing portion is 45°.

(iii) No reflection member is provided on a side of the LED chip such that light emitted from the LED chip can be extracted through a side surface of the sealing portion.

(iv) The LED chip comprises a blue LED chip and the sealing portion comprises a phosphor to generate a yellow fluorescence.

EFFECTS OF THE INVENTION

According to one embodiment of the invention, a light-emitting device can be provided that may have a high light extraction efficiency or lower in a manufacturing cost

BRIEF DESCRIPTION OF THE DRAWINGS

Next, the present invention will be explained in more detail in conjunction with appended drawings, wherein:

FIGS. 2A and 2B are schematic top views showing a relation between intensity and direction of light emitted from an LED chip of the light-emitting device in the first embodiment;

DESCRIPTION OF THE PREFERRED EMBODIMENTS

First Embodiment

Figure 1A:
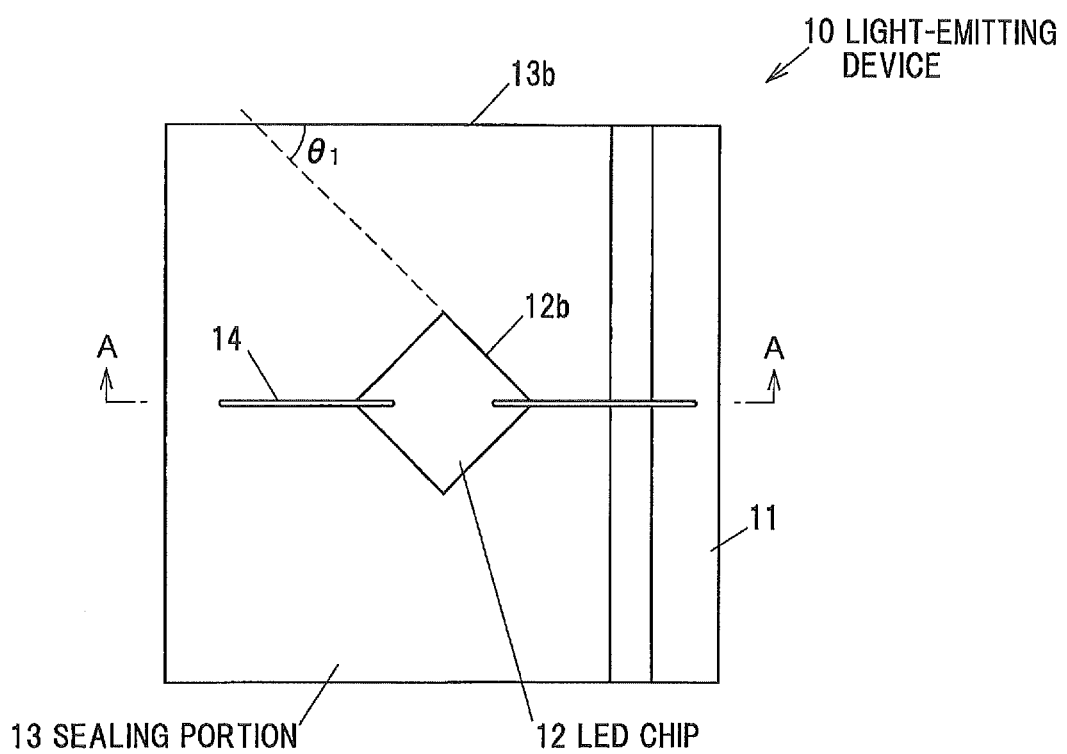
FIG. 1A is a top view showing a light-emitting device in a first embodiment and FIG. 1B is a vertical cross-sectional view of the light-emitting device taken on line A-A of FIG. 1A.
Figure 1B:
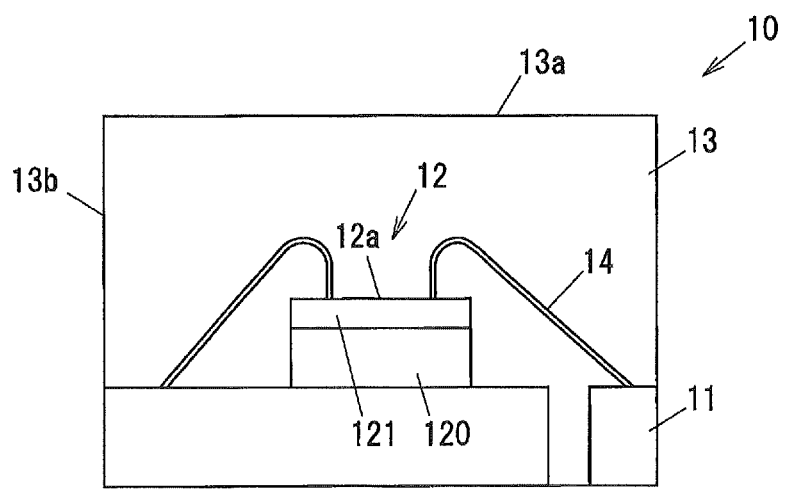

FIG. 1A is a top view showing a light-emitting device 10 in the first embodiment. FIG. 1B is a vertical cross-sectional view of the light-emitting device 10 taken on line A-A of FIG. 1A. The light-emitting device 10 has a lead frame 11, an LED chip 12 mounted on the lead frame 11 and having a rectangular shape (including a square) in a top view, and a rectangular parallelepiped-shaped sealing portion 13 formed on the lead frame 11 to seal the LED chip 12.

The light-emitting device 10 is not provided with any member such as a reflector to reflect light on the side of the LED chip 12 such that light emitted from the LED chip 12 can be also extracted through a side surface 13b of the sealing portion 13.

The LED chip 12 and the sealing portion 13 are placed so that an upper surface 12a of the LED chip 12 is parallel to an upper surface 13a of the sealing portion 13. An angle θ, formed by a side surface 12b of the LED chip 12 and the side surface 13b of the sealing portion 13 is 45±13°.

The LED chip 12 has a chip substrate 120 and a crystal layer 121. The LED chip 12 is a face-up type LED chip in which the crystal layer 121 faces upward. The chip substrate 120 is, e.g., a sapphire substrate. The crystal layer 121 is a layer of, e.g., GaN-based semiconductor formed on the chip substrate 120 by epitaxial crystal growth and has a light-emitting layer sandwiched between an n-type semiconductor layer and a p-type semiconductor layer. The n-type and p-type semiconductor layers of the crystal layer 121 are respectively connected to the lead frame 11 by wires 14.

The lead frame 11 is formed of, e.g., Ag. Alternatively, another member such as a substrate having a wiring on a surface thereof may be used in place of the lead frame 11.

The sealing portion 13 is formed of a transparent resin such as silicone resin or epoxy resin. In addition, the sealing portion 13 may contain phosphor particles. When an LED chip to emit a blue light is used as the LED chip 12 and the sealing portion 13 contains phosphor particles to generate a yellow fluorescence, a white light as a mixture of the blue light and the yellow light can be extracted from the LED chip 12.

FIG. 2A is a schematic top view showing a relation between intensity and direction of light emitted from the LED chip 12. In FIG. 2A, a large hollow arrow indicates light with high intensity and a small solid arrow indicates light with low intensity. It should be noted that illustrations of members other than the LED chip 12 and the sealing portion 13 are omitted in FIG. 2A.

As shown in FIG. 2A, light (the large hollow arrow) emitted from a boundary between adjacent side surfaces 12b of the LED chip 12 (emitted from a corner in a top view) in a direction inclined at 45° with respect to the side surface 12b has higher intensity than light (the small solid arrow) emitted from the side surface 12b in a direction perpendicular to the side surface 12b. Although FIG. 2A is a schematic view showing the upper surface 12a having a square shape, this relation between intensity and direction of light emitted from the LED chip 12 holds true even for the upper surface 12a having a rectangular shape other than square.

As shown in FIG. 2B, intense light emitted from the boundary between adjacent side surfaces 12b of the LED chip 12 in a direction inclined at 45° with respect to the side surface 12b is incident on a side surface of the sealing portion 13 (an interface between the sealing portion 13 and the air) at a small incident angle (within 13°, and 0° when $θ_1$=45°) and is thus transmitted to the outside with almost no internal reflection. Therefore, the light-emitting device 10 is excellent in light extraction efficiency.

Figure 3A:
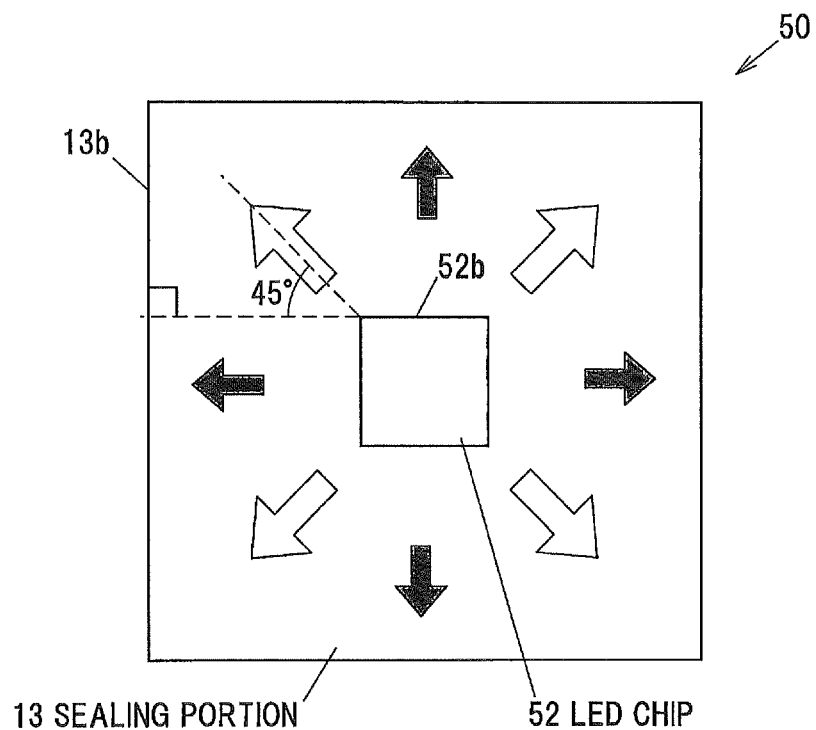
FIGS. 3A and 3B are schematic top views showing a relation between intensity and direction of light emitted from an LED chip of a light-emitting device as Comparative Example.

FIG. 3A is a schematic top view showing a relation between intensity and direction of light emitted from an LED chip 52 of a light-emitting device 50 as Comparative Example. The LED chip 52 is placed so that a side surface 52b and the side surface 13b of the sealing portion 13 form a right angle (or are parallel) as is a typical conventional LED chip.

Figure 3B:
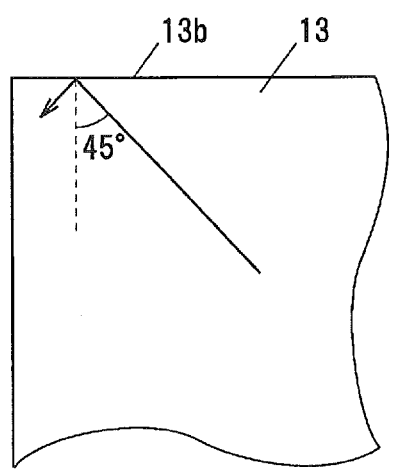

In Comparative Example, intense light emitted from a boundary between adjacent side surfaces 52b of the LED chip 52 in a direction inclined at 45° with respect to the side surface 52b is incident on the side surface of the sealing portion 13 at a large incident angle (45°, as shown in FIG. 3B. Since the incident angle is close to a critical angle, a large portion of the light is reflected without being transmitted, and further, the incident angle exceeds the critical angle depending on a refractive index of the sealing portion 13 and total reflection occurs. Therefore, light extraction efficiency of the light-emitting device in Comparative Example is inferior to that of the light-emitting device 10 in the first embodiment.

FIGS. 4A to 6B are graphs showing examples of orientation dependence of emission intensity of the LED chip 12. In the LED chips 12 in FIGS. 4A to 6B, each upper surface 12a has a square shape and the chip substrates 120 respectively have thicknesses of 100 μm, 140 μm and 180 μm.

Figure 4A:
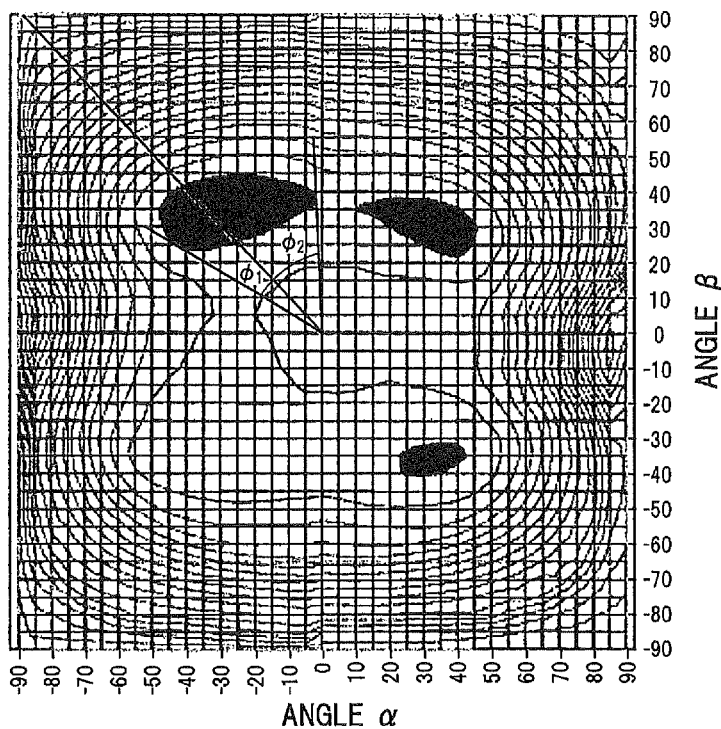
FIGS. 4A and 4B are graphs showing an example of orientation dependence of emission intensity of the LED chip in the first embodiment.
Figure 4B:
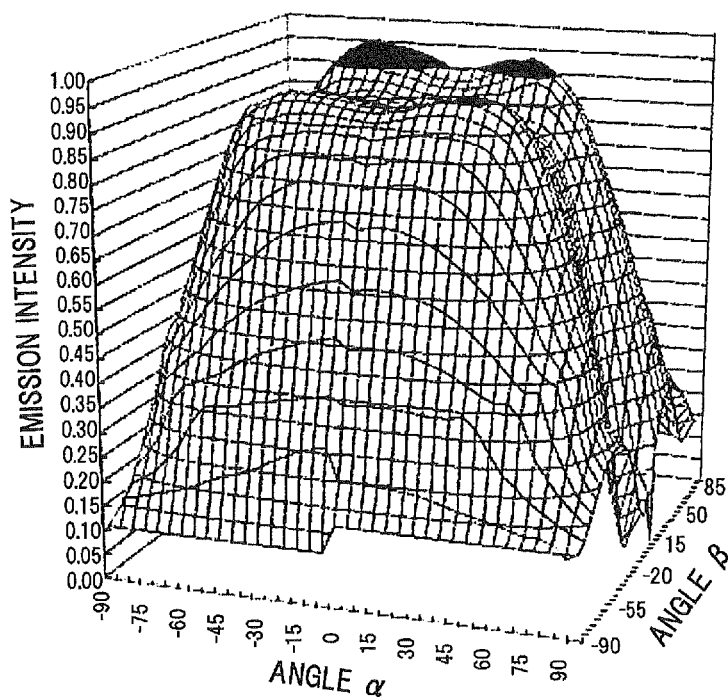
Figure 5A:
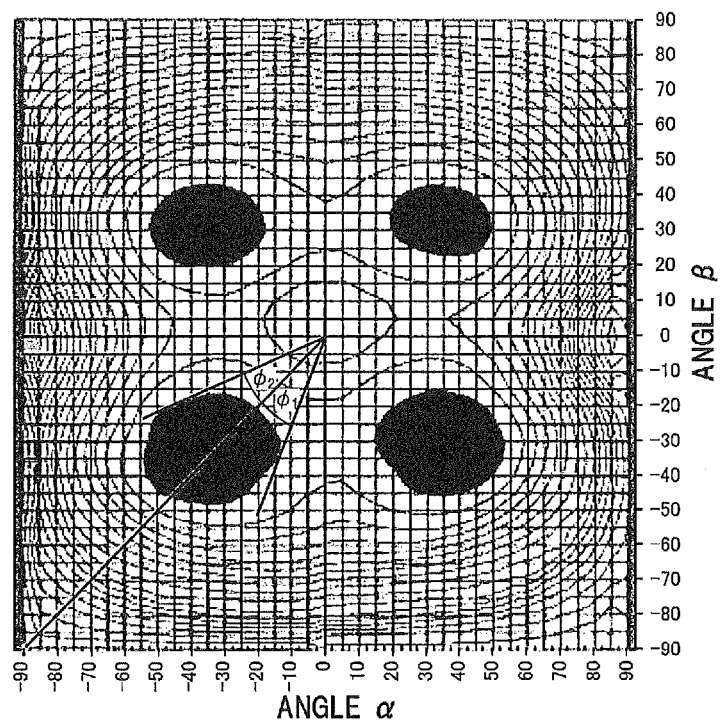
FIGS. 5A and 5B are graphs showing an example of orientation dependence of emission intensity of the LED chip in the first embodiment.
Figure 5B:
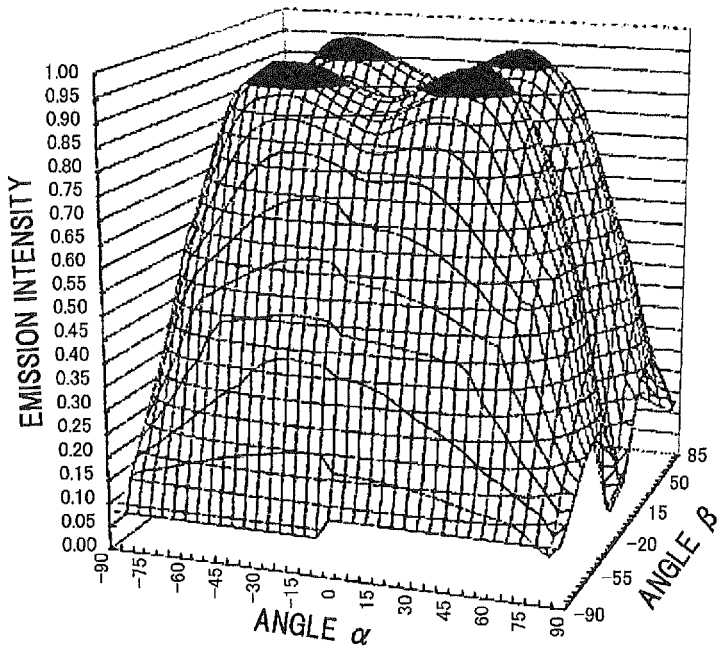
Figure 6A:
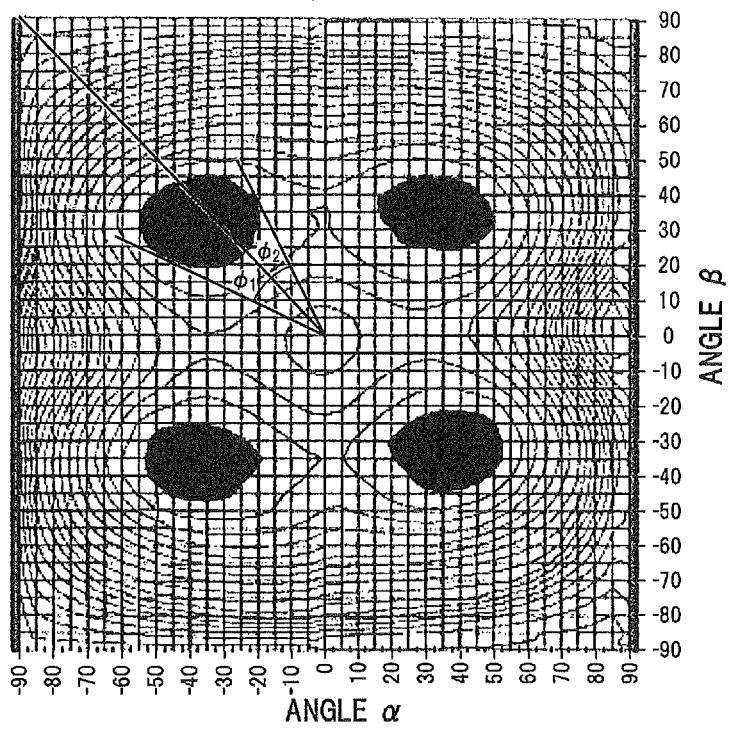
FIGS. 6A and 6B are graphs showing an example of orientation dependence of emission intensity of the LED chip in the first embodiment.
Figure 6B:
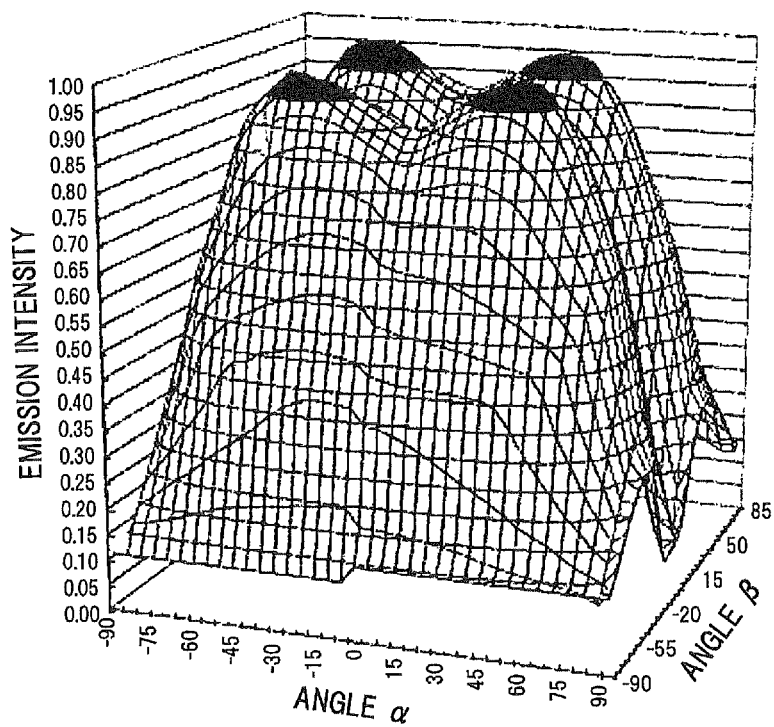

The emission intensity distributions shown in FIGS. 4A to 6B were measured by relatively moving a light-receiving element of an emission intensity measuring device around the LED chip 12 while maintaining a regular interval. In FIGS. 4A, 5A and 6A, a horizontal axis indicates an angle α and a vertical axis indicates an angle β. In FIGS. 4A, 5A and 6A, emission intensity is shown by isointensity lines, and a black-filled area which includes a top of the isointensity line is a region in which emission intensity is not less than 95% on the basis of the maximum value. FIGS. 4B, 5B and 6B are graphs respectively three-dimensionally showing FIGS. 4A, 5A and 6A, in which a height of curved surface shows a level of emission intensity.

Figure 7:
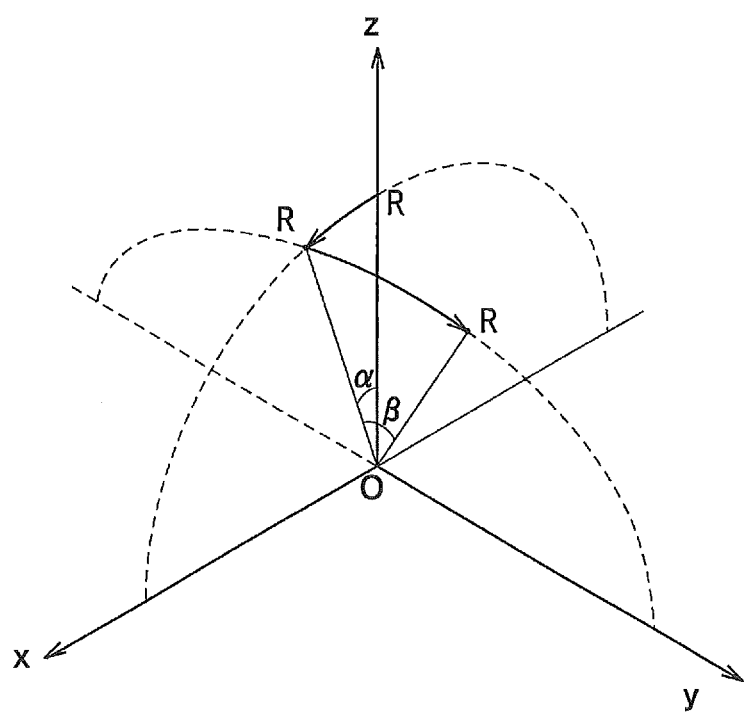
FIG. 7 is an explanatory diagram illustrating a measurement range of emission intensity distribution in FIGS. 4A and 6B.

The angles α and β will be described below in reference to FIG. 7. Here, a center of the upper surface of the LED chip 12 is defined as a center O, an axis passing through the center O and extending in a direction parallel to one side of the upper surface of the LED chip 12 is defined as an x-axis, an axis passing through the center O and orthogonal to the x-axis within the upper surface of the LED chip 12 is defined as a y-axis, and an axis passing through the center O and extending perpendicular to the upper surface of the LED chip 12 is defined as a z-axis.

The light-receiving element is relatively moved so that a line segment OR connecting a center R of the light-receiving element on the z-axis and the center O is tilted by the angle α in an x-axis direction, and then, the light-receiving element is further relatively moved so that the line segment OR is tilted by the angle β in a y-axis direction, and emission intensity is measured at this position. This measurement was conducted in a range of −90≤α≤90 and −90≤β≤90.

FIGS. 4A to 6B show that the light emitted from the boundary between adjacent side surfaces 12b of the LED chip 12 in a direction inclined at 45° with respect to the side surface 12b has particularly high intensity which is higher than that of the light emitted from the side surface 12b in a direction perpendicular to the side surface 12b.

Next, a range of emission angle from the boundary between adjacent side surfaces 12b of the LED chip 12 which provides high light intensity (not less than 95%), i.e., a value $ω_1$ when expressing a range providing high-intensity light emission as a direction inclined at 45°±$ω_1$ with respect to the side surface 12b, is derived from FIGS. 4A to 6B. Here, the direction inclined at 45° with respect to the side surface 12b is determined as a center of the angle range because intensity of light emitted in this direction is particularly high, and also, the angle $θ_1$ formed by the side surface 12b of the LED chip 12 and the side surface 13b of the sealing portion 13 is 45° when this direction perpendicularly crosses the side surface 13b of the sealing portion 13 (the incident angle of 0°) and it is relatively easy to adjust an installation angle of the LED chip 12.

In order to determine the range providing high-intensity light emission on the basis of the range with the highest emission intensity, the angle range from the center in the black-filled area in the upper left of the center of FIG. 4A, that in the black-filled area in the lower left of the center of FIG. 5A and that in the black-filled area in the upper left of the center of FIG. 6A are examined. Note that, the angle range providing high-intensity light emission derived from FIGS.

4A to 6B is substantially equal to the angle range providing high-intensity light emission when viewing the LED chip 12 from the top.

On the basis of a direction passing through the boundary between adjacent side surfaces 12b of the LED chip 12 and inclined at 45° with respect to the side surface 12b, an angle range in a counterclockwise direction is defined as $\Phi_1$, an angle range in a clockwise direction is defined as $\Phi_2$, and a minimum value among six $\Phi_1$ and $\Phi_2$ values derived from FIGS. 4A to 6B is defined as $\omega_1$.

$\Phi_1$ and $\Phi_2$ in FIGS. 4A, 4B are respectively 13° and 43°. $\Phi_1$ and $\Phi_2$ in FIGS. 5A, 5B are respectively 23° and 22°. $\Phi_1$ and $\Phi_2$ in FIGS. 6A, 6B are respectively 21° and 17°. If 13° as the minimum value of the above values is determined as $\omega_1$, it can be said that the LED chips 12 in FIGS. 4A to 6B emit high intensity light from the boundary between adjacent side surfaces 12b of the LED chip 12 in a direction inclined at 45°±17° with respect to the side surface 12b.

Accordingly, when the angle $\theta_1$ formed by the side surface 12b of the LED chip 12 and the side surface 13b of the sealing portion 13 is 45±13°, high intensity light is incident on the side surface of the sealing portion 13 at a small incident angle (a portion of the high intensity light is incident on the side surface of the sealing portion 13 at an incident angle of 0°) and is transmitted to the outside with almost no internal reflection.

Second Embodiment

The second embodiment is different from the first embodiment in a form of the LED chip. Note that, explanations of the same features as those in the first embodiment will be omitted or simplified.

Figure 8A:
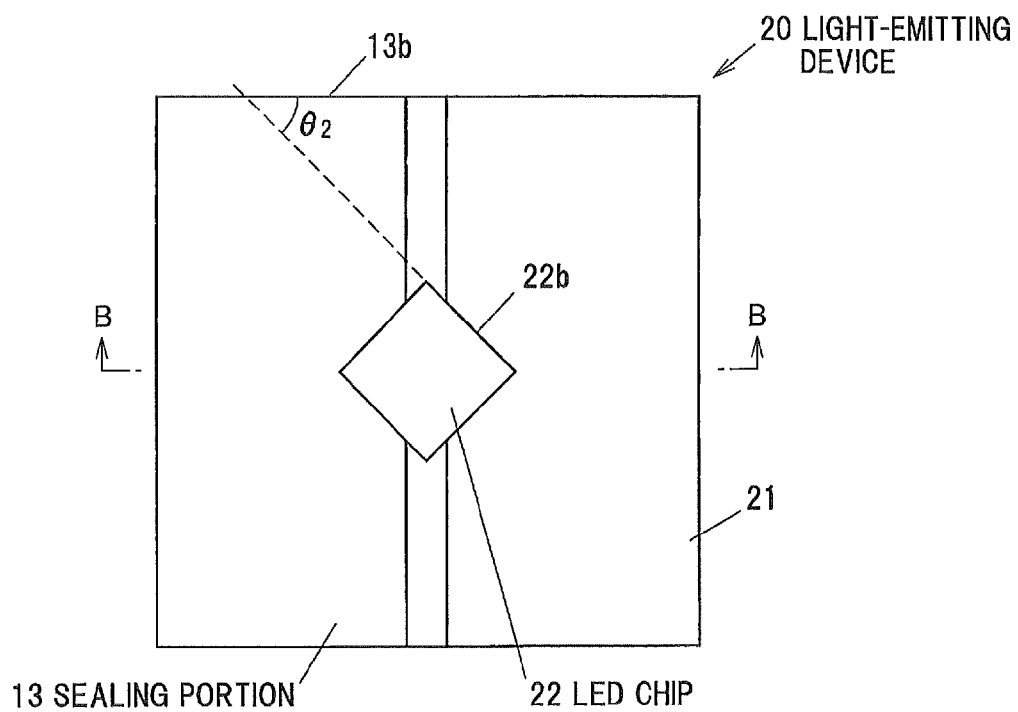
FIG. 8A is a top view showing a light-emitting device in a second embodiment and FIG. 8B is a vertical cross-sectional view of the light-emitting device taken on line B-B of FIG. 8A.
Figure 8B:
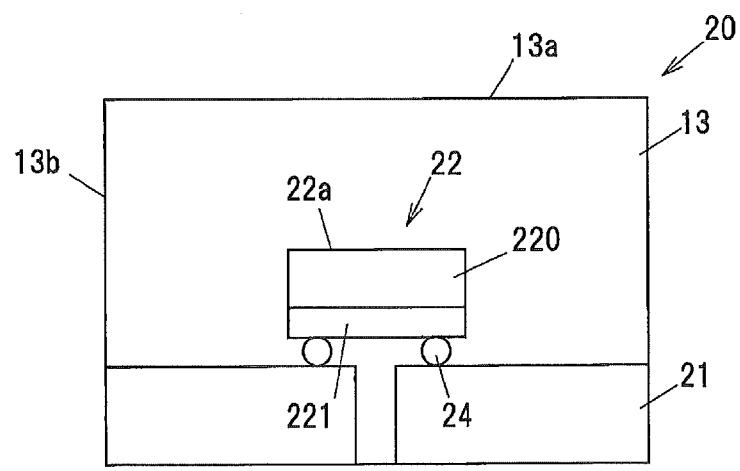

FIG. 8A is a top view showing a light-emitting device 20 in the second embodiment. FIG. 8B is a vertical cross-sectional view of the light-emitting device 20 taken on line B-B of FIG. 8A. The light-emitting device 20 has a lead frame 21, an LED chip 22 mounted on the lead frame 21 and having a rectangular shape (including a square) in a top view, and the rectangular parallelepiped-shaped sealing portion 13 formed on the lead frame 21 to seal the LED chip 22.

In the light-emitting device 20, a member for reflecting light such as reflector is not included on a side of the LED chip 22 and light emitted from the LED chip 22 is thus also emitted from the side surface 13b of the sealing portion 13.

The LED chip 22 and the sealing portion 13 are placed so that an upper surface 22a of the LED chip 22 is parallel to the upper surface 13a of the sealing portion 13. An angle $\theta_2$ formed by a side surface 22b of the LED chip 22 and the side surface 13b of the sealing portion 13 is 45±14°.

The LED chip 22 has a chip substrate 220 and a crystal layer 221. The LED chip 22 is a flip-chip type LED chip in which the crystal layer 221 faces downward. The chip substrate 220 is, e.g., a sapphire substrate. The crystal layer 221 is a layer of, e.g., GaN-based semiconductor formed on the chip substrate 220 by epitaxial crystal growth and has a light-emitting layer sandwiched between an n-type semiconductor layer and a p-type semiconductor layer. The n-type and p-type semiconductor layers of the crystal layer 221 are respectively connected to the lead frame 21 by bumps 24.

In the LED chip 22, light emitted from a boundary between adjacent side surfaces 22b of the LED chip 22 in a direction inclined at 45° with respect to the side surface 22b has higher intensity than light emitted from the side surface 22b in a direction perpendicular to the side surface 22b in the same manner as the LED chip 12 in the first embodiment. Although FIG. 8A is a schematic view showing the upper surface 22a having a square shape, this relation between intensity and direction of light emitted from the LED chip 22 holds true even for the upper surface 22a having a rectangular shape other than square.

In addition, intense light emitted from the boundary between adjacent side surfaces 22b of the LED chip 22 in a direction inclined at 45° with respect to the side surface 22b is incident on the side surface of the sealing portion 13 at a small incident angle (within 14°, and 0° when $\theta_2$=45°) and is thus transmitted to the outside with almost no internal reflection. Therefore, the light-emitting device 20 is excellent in light extraction efficiency.

FIGS. 9A to 11B are graphs showing examples of orientation dependence of emission intensity of the LED chip 22. In the LED chips 22 in FIGS. 9A to 11B, each upper surface 22a has a square shape and the chip substrates 220 respectively have thicknesses of 100 μm, 200 μm and 375 μm. The emission intensity distributions shown in FIGS. 9A to 11B were measured by the same method as the first embodiment.

Figure 9A:
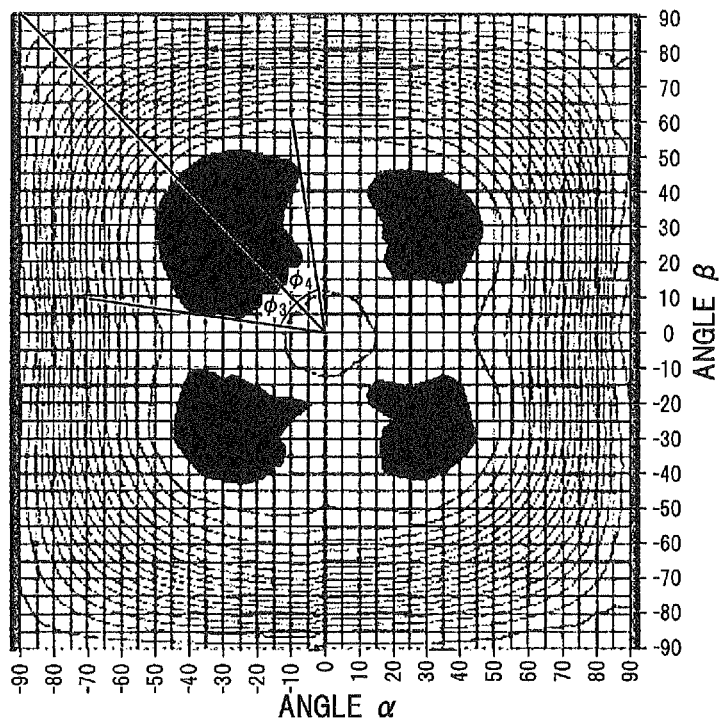
FIGS. 9A and 9B are graphs showing an example of orientation dependence of emission intensity of the LED chip in the second embodiment.
Figure 9B:
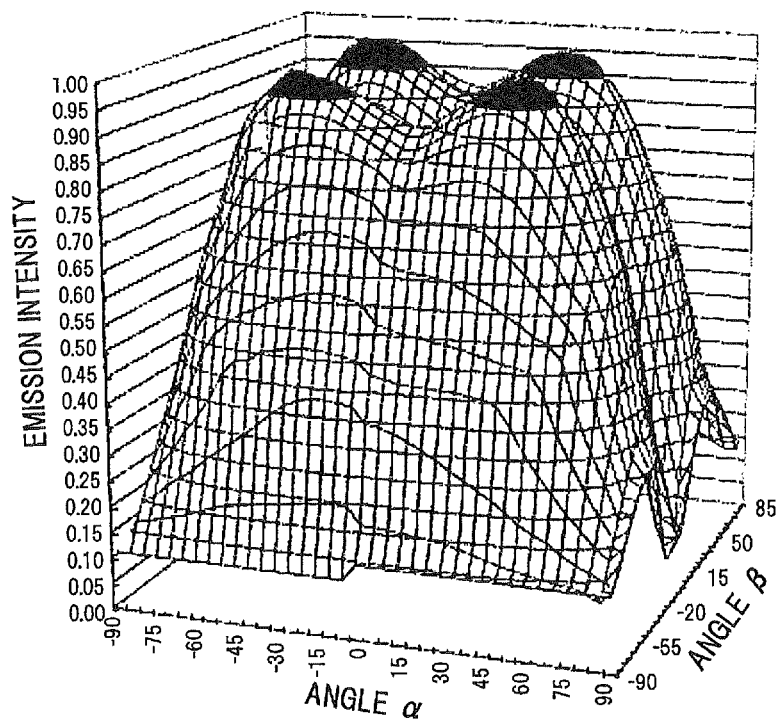
Figure 10A:
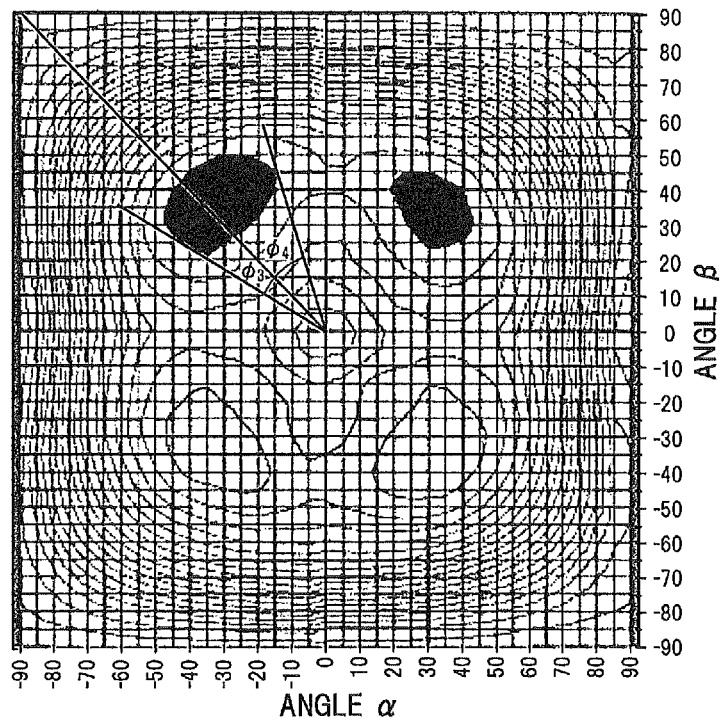
FIGS. 10A and 10B are graphs showing an example of orientation dependence of emission intensity of the LED chip in the second embodiment.
Figure 10B:
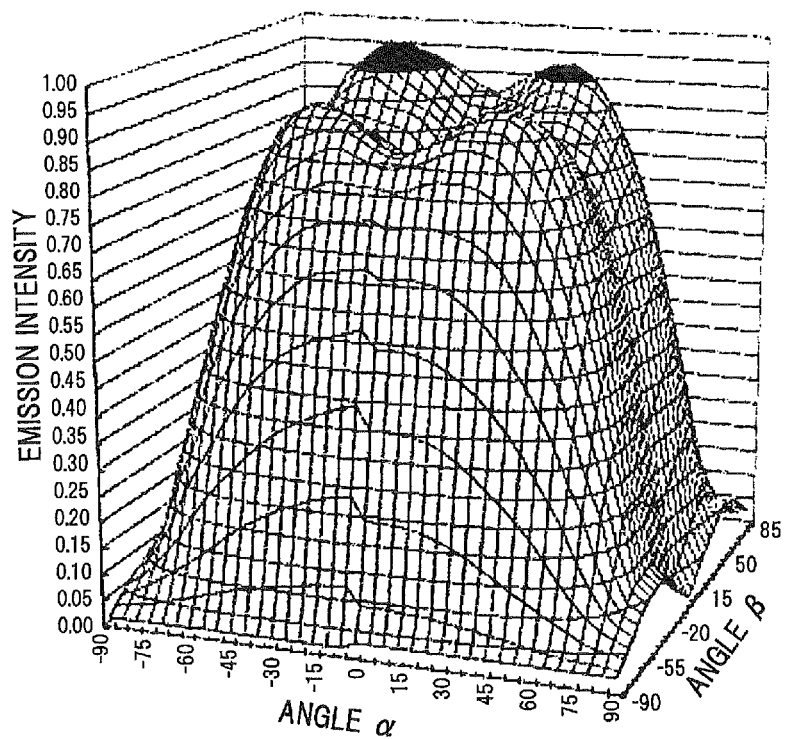
Figure 11A:
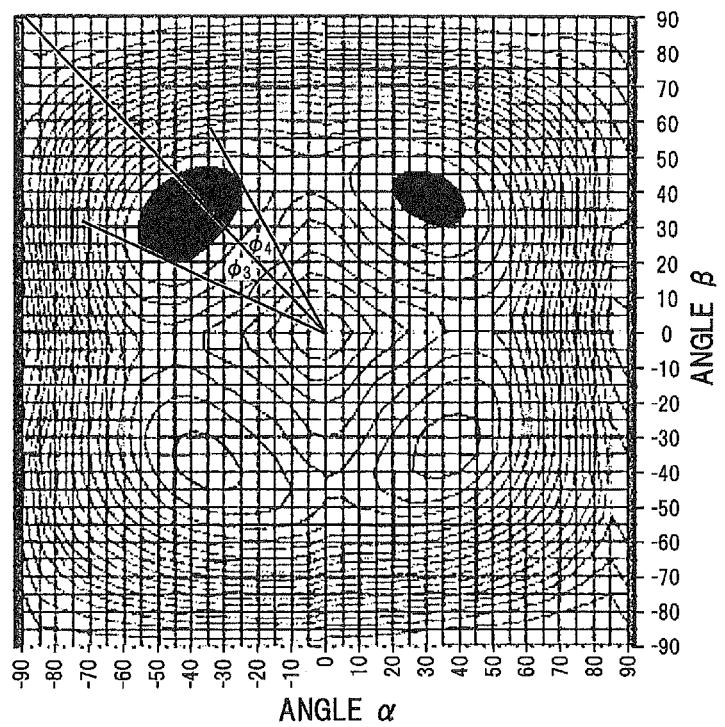
FIGS. 11A and 11B are graphs showing an example of orientation dependence of emission intensity of the LED chip in the second embodiment.
Figure 11B:
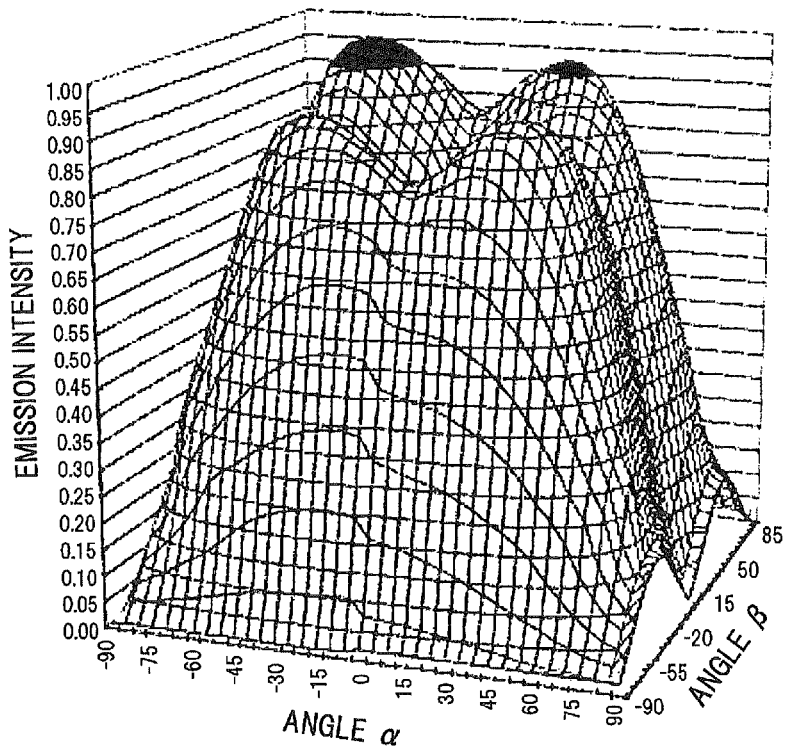

In FIGS. 9A, 10A and 11A, a horizontal axis indicates an angle α and a vertical axis indicates an angle β. In FIGS. 9A, 10A and 11A, emission intensity is shown by isointensity lines, and a black-filled area which includes a top of the isointensity line is a region in which emission intensity is not less than 95% on the basis of the maximum value. FIGS. 9B, 10B and 11B are graphs respectively three-dimensionally showing FIGS. 9A, 10A and 11A, in which a height of curved surface shows a level of emission intensity.

FIGS. 9A to 11B show that the light emitted from the boundary between adjacent side surfaces 22b of the LED chip 22 in a direction inclined at 45° with respect to the side surface 22b has particularly high intensity which is higher than that of the light emitted from the side surface 22b in a direction perpendicular to the side surface 22b.

Next, a range of emission angle from the boundary between adjacent side surfaces 22b of the LED chip 22 which provides high light intensity (not less than 95%), i.e., a value $\omega_2$ when expressing a range providing high-intensity light emission as a direction inclined at 45°±$\omega_2$ with respect to the side surface 22b is derived from FIGS. 9A to 11B.

In order to determine the range providing high-intensity light emission on the basis of the range with the highest emission intensity, the angle range from the center in the black-filled area in the upper left of the center of FIG. 9A, that in the black-filled area in the upper left of the center of FIG. 10A and that in the black-filled area in the upper left of the center of FIG. 11A are examined. On the basis of a direction passing through the boundary between adjacent side surfaces 22b of the LED chip 22 and inclined at 45° with respect to the side surface 22b, an angle range in a counterclockwise direction is defined as $\Phi_3$, an angle range in a clockwise direction is defined as $\Phi_4$, and a minimum value among six $\Phi_3$ and $\Phi_4$ values derived from FIGS. 9A to 11B is defined as $\omega_2$.

$\Phi_3$ and $\Phi_4$ in FIGS. 9A, 9B are respectively 38° and 35°. $\Phi_3$ and $\Phi_4$ in FIGS. 10A, 10B are respectively 15° and 27°. $\Phi_3$ and $\Phi_4$ in FIGS. 11A, 11B are respectively 22° and 14°. When 14° as the minimum value of the above values is determined as $\omega_2$, it can be said that the LED chips 22 in FIGS. 9A to 11B emit high intensity light from the boundary between adjacent side surfaces 22b of the LED chip 22 in a direction inclined at 45°±14° with respect to the side surface 22b.

Accordingly, when the angle $\theta_2$ formed by the side surface 22b of the LED chip 22 and the side surface 13b of the sealing portion 13 is 45±14°, high intensity light is incident on the side surface of the sealing portion 13 at a small incident angle (a portion of the high intensity light is incident on the side surface of the sealing portion 13 at an incident angle of 0°) and is transmitted to the outside with almost no internal reflection.

Effects of the Embodiments

The first and second embodiments are characterized in an installation angle of the LED chip in a plane direction with respect to the sealing portion and this allows a light-emitting device excellent in light extraction efficiency to be obtained even using a rectangular parallelepiped-shaped sealing portion which is inexpensive to form.

The light-emitting devices in the first and second embodiments have better light extraction efficiency than a conventional light-emitting device using a rectangular parallelepiped-shaped sealing portion and have superiority which is increased especially when a refractive index of the sealing portion is high. This is because, the higher the refractive index of the sealing portion, the higher the reflectivity with respect to the incident angle onto the interface between the sealing portion and the air.

For example, the critical angle of the interface between the sealing portion and the air becomes smaller than 45° when the refractive index of the sealing portion is greater than 1.41 and, in case that the LED chip is placed at an angle shown in FIG. 3A, high intensity light emitted from the boundary between adjacent side surfaces of the LED chip in a direction inclined at 45° with respect to the side surface is totally reflected at the interface between the sealing portion and the air, which causes a significant decrease in light extraction efficiency of the light-emitting device. Therefore, the first and second embodiments are remarkably effective especially when the refractive index of the sealing portion is greater than 1.41.

The present invention is not intended to be limited to the above-mentioned embodiments, and the various kinds of modifications can be implemented without departing from the gist of the invention.

In addition, the invention according to claims is not to be limited to the above-mentioned embodiments. Further, please note that all combinations of the features described in the embodiments are not necessary to solve the problem of the invention.

What is claimed is:

1. A light-emitting device, comprising:
    a face-up type LED chip formed rectangular in a top view; and
    a rectangular parallelepiped-shaped sealing portion to seal the LED chip,
    wherein an angle between a side surface of the LED chip and a side surface of the sealing portion in the top view is 45±13°,
    wherein a portion of a light emitted from the LED chip is emitted through the side surface of the sealing portion, and
    wherein the LED chip comprises an insulating substrate.

2. The light-emitting device according to claim 1, wherein a refractive index of the sealing portion is greater than 1.41.

3. The light-emitting device according to claim 1, wherein the angle between the side surface of the LED chip and the side surface of the sealing portion is 45°.

4. The light-emitting device according to claim 1, wherein no reflection member is provided on a side of the LED chip such that light emitted from the LED chip can be extracted through the side surface of the sealing portion.

5. The light-emitting device according to claim 1, wherein the LED chip comprises a blue LED chip and the sealing portion comprises a phosphor to generate a yellow fluorescence.

6. The light-emitting device according to claim 1, wherein a light is incident on the side surface of the sealing portion at an incident angle of 0°.

7. The light-emitting device according to claim 1, wherein a light incident on the side surface of the sealing portion is transmitted to an outside with zero internal reflection.

8. The light-emitting device according to claim 1, wherein the substrate comprises a sapphire substrate.

9. The light-emitting device according to claim 1, wherein the angle is defined so as to increase a light extraction efficiency of the device.

10. A light-emitting device, comprising:
    a flip-chip type LED chip formed rectangular in a top view; and
    a rectangular parallelepiped-shaped sealing portion to seal the LED chip,
    wherein an angle between a side surface of the LED chip and a side surface of the sealing portion in the top view is 45±14°, and
    wherein a portion of a light emitted from the LED chip is emitted through the side surface of the sealing portion,
    wherein the LED chip comprises an insulating substrate.

11. The light-emitting device according to claim 10, wherein a refractive index of the sealing portion is greater than 1.41.

12. The light-emitting device according to claim 10, wherein the angle between the side surface of the LED chip and the side surface of the sealing portion is 45°.

13. The light-emitting device according to claim 10, wherein no reflection member is provided on a side of the LED chip such that light emitted from the LED chip can be extracted through the side surface of the sealing portion.

14. The light-emitting device according to claim 10, wherein the LED chip comprises a blue LED chip and the sealing portion comprises a phosphor to generate a yellow fluorescence.

15. The light-emitting device according to claim 10, wherein said angle permits said light to be transmitted to an outside with zero internal reflection.

16. The light-emitting device according to claim 10, wherein the substrate comprises a sapphire substrate.

17. The light-emitting device according to claim 10, wherein the angle is defined so as to increase a light extraction efficiency of the device.

* * * * *